(12) United States Patent
Kitanaka et al.

(10) Patent No.: US 10,555,442 B2
(45) Date of Patent: Feb. 4, 2020

(54) POWER CONVERSION DEVICE

(71) Applicant: Mitsubishi Electric Corporation, Chiyoda-ku, Tokyo (JP)

(72) Inventors: Hidetoshi Kitanaka, Tokyo (JP); Hiroki Kawamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/304,007

(22) PCT Filed: Jun. 1, 2016

(86) PCT No.: PCT/JP2016/066144
§ 371 (c)(1),
(2) Date: Nov. 21, 2018

(87) PCT Pub. No.: WO2017/208384
PCT Pub. Date: Dec. 7, 2017

(65) Prior Publication Data
US 2019/0208671 A1   Jul. 4, 2019

(51) Int. Cl.
*H05K 5/00* (2006.01)
*H05K 7/20* (2006.01)
(Continued)

(52) U.S. Cl.
CPC ....... *H05K 7/20909* (2013.01); *H01L 23/467* (2013.01); *H02M 3/33569* (2013.01);
(Continued)

(58) Field of Classification Search
CPC .................... H05K 5/00; H05K 7/20
(Continued)

(56) References Cited

U.S. PATENT DOCUMENTS 6,144,556 A * 11/2000 Lanclos ............. H05K 7/20145
361/695
7,483,272 B2 * 1/2009 Hussaini ............... H02J 7/0042
174/50
(Continued)

FOREIGN PATENT DOCUMENTS

DE   102014001423 A1   8/2015
EP       2833239 A1   2/2015
(Continued)

OTHER PUBLICATIONS

Extended European Search Report dated May 7, 2019, issued by the European Patent Office in corresponding European Application No. 16904009.4. (7 pages).
(Continued)

*Primary Examiner* — Xiaoliang Chen
(74) *Attorney, Agent, or Firm* — Buchanan Ingersoll & Rooney PC

(57) ABSTRACT

An inside of a housing of a power conversion device is partitioned by partitioning walls, and the power conversion device is configured from: an open part, into which external air flows; a first airtight part that is adjacent to the open part and into which no external air flows; and a second airtight part that is adjacent to the first airtight part and into which external air does not flow. At least two ventilation holes are formed in a partition wall between the first airtight part and the second airtight part. A circulation fan is provided to at least one of the at least two ventilation holes. The outer surface of the first airtight part is provided with a heatsink that dissipates heat transferred from an electronic component placed in the first airtight part, the heatsink being exposed to the open part.

4 Claims, 6 Drawing Sheets

(51) Int. Cl.
    *H02M 7/04*      (2006.01)
    *H02M 7/48*      (2007.01)
    *H02M 7/00*      (2006.01)
    *H01L 23/467*    (2006.01)
    *H02M 3/335*     (2006.01)
    *H02M 7/5387*    (2007.01)

(52) U.S. Cl.
    CPC ............. *H02M 7/003* (2013.01); *H02M 7/04* (2013.01); *H02M 7/48* (2013.01); *H02M 7/53871* (2013.01); *H05K 7/20154* (2013.01); *H05K 7/20172* (2013.01); *H05K 7/20209* (2013.01); *H05K 7/20863* (2013.01); *H05K 7/20918* (2013.01); *H05K 7/20945* (2013.01)

(58) Field of Classification Search
    USPC .......... 361/697, 600, 679.01, 692, 695, 704, 361/715, 752
    See application file for complete search history.

(56) References Cited

U.S. PATENT DOCUMENTS

| | | | | |
|---|---|---|---|---|
| 2006/0087815 A1* | 4/2006 | Lanni | ................ | H05K 7/20136 |
| | | | | 361/695 |
| 2006/0171115 A1 | 8/2006 | Cramer | | |
| 2012/0250255 A1* | 10/2012 | Shigeno | ............. | H05K 7/20918 |
| | | | | 361/692 |
| 2012/0262891 A1* | 10/2012 | Nagatomo | ........... | H05K 7/1432 |
| | | | | 361/752 |
| 2015/0049431 A1 | 2/2015 | Kondo et al. | | |
| 2015/0153792 A1 | 6/2015 | Chen | | |
| 2015/0216090 A1* | 7/2015 | Sakuma | ................. | H05K 7/202 |
| | | | | 361/697 |
| 2015/0245537 A1* | 8/2015 | Sakuma | ................ | H01F 27/085 |
| | | | | 363/141 |
| 2016/0037677 A1* | 2/2016 | Yamanaka | ......... | H05K 7/20918 |
| | | | | 361/697 |
| 2017/0188488 A1* | 6/2017 | Takezawa | ............... | H02M 7/48 |
| 2018/0284853 A1 | 10/2018 | Kruse | | |

FOREIGN PATENT DOCUMENTS

| | | |
|---|---|---|
| JP | 2005001598 A | 1/2005 |
| JP | 2009096460 A | 5/2009 |

OTHER PUBLICATIONS

International Search Report (with English Translation) and Written Opinion issued in International Patent Application No. PCT/JP2016/066144, 6 pages, dated Jul. 12, 2016.

* cited by examiner

POWER CONVERSION DEVICE

TECHNICAL FIELD

The present disclosure relates to a power conversion device including an electronic component subjected to forced air cooling.

BACKGROUND ART

A power conversion device that converts power acquired from an overhead line to supply the converted power to a motor or an in-vehicle device is mounted on a roof of or under a floor of an electric railroad vehicle. The power conversion device contains a power convertor that converts input power by switching operation of a semiconductor element and outputs a desired alternating-current power. Since the semiconductor element generates heat during the switching operation, the power conversion device is provided with a plate-fin or pin-fin heatsink for releasing heat transferred from the semiconductor element. In order to improve cooling efficiency, the heatsink is arranged at a location where the heatsink is subjected to external air. The semiconductor element included in the power converter and the electronic component included in an output controller outputting a control signal to the power converter are arranged inside a housing of the vehicle not to be subjected to the external air in order to suppress or prevent malfunctions of the semiconductor element and the electronic component due to dust or moisture. As described above, a location of each component of the power conversion device arranged is determined in accordance with the necessity of cooling and the necessities of dust prevention and water proof.

In a power conversion system for an AC-DC dual current electric railroad vehicle disclosed in Patent Literature 1, a converter, an inverter, and a filter reactor that require forced air cooling and another component not requiring forced air cooling are placed together in the same housing. In the power conversion system for an AC-DC dual current electric railroad vehicle, the convertor, the invertor and the filter reactor are placed in a cooling air passage provided inside the housing and the another component not requiring forced air cooling is placed outside the cooling air passage. As in an underfloor device for a railroad vehicle disclosed in Patent Literature 2, the inside space of a housing of a power conversion device placed under a floor of a railroad vehicle is partitioned into a plurality of spaces by partition elements.

CITATION LIST

Patent Literature

Patent Literature 1: Unexamined Japanese Patent Application Kokai Publication No. 2005-001598
Patent Literature 2: Unexamined Japanese Patent Application Kokai Publication No. 2009-96460

SUMMARY OF INVENTION

Technical Problem

In the power conversion system for an AC-DC dual current electric railroad vehicle disclosed in Patent Literature 1, the components to be subjected to forced air cooling are sufficiently cooled however a situation may occur where another component placed outside the cooling air passage is not sufficiently cooled. In the case where the inside space of the housing is partitioned into the plurality of spaces as in the underfloor device for a railroad vehicle disclosed in Patent Literature 2, rises in temperature in partitioned spaces near the center of the housing may be greater than rises in temperature in the other partitioned spaces. If a rise in temperature in a portion of the inside space of the housing is larger than a rise in temperature in another portion of the inside space of the housing, performances of the electronic components placed in the portion in which the larger rise in temperature occurs may be adversely affected.

The present disclosure is made in order to solve the aforementioned problems, and thus an objective of the present disclosure is to reduce a difference in rise in temperature in respective portions in a housing.

Solution to Problem

In order to achieve the above objective, a power conversion device of the present disclosure including a power convertor for converting an input power to output the converted power, a reactor connected to an input side of the power convertor, and a controller for controlling an electronic component included in the power convertor includes an open part, a first airtight part, and a second airtight part. External air that is air from outside of the power conversion device flows into the open part, and the reactor is placed in the open part. External air does not flow into the first airtight part adjacent to the open part, and the electronic component is placed in the first airtight part. External air does not flow into the second airtight part adjacent to the first airtight part, and the controller is placed in the second airtight part. The power conversion device includes: at least two ventilation holes that are formed in a partition wall between the first airtight part and the second airtight part; a circulation fan with which at least one of the two ventilation holes is provided; and a heatsink that is placed in a housing forming the first airtight part and that releases, to outside of the power conversion device, at least some of heat transferred from the electronic component placed in the first airtight part.

Advantageous Effects of Invention

The power conversion device according to the present disclosure has a structure in which at least two ventilation holes are formed in the partition wall between the first airtight part and the second airtight part and the circulation fan is provided in at least one of the two ventilation holes, and thus the power conversion device of the present disclosure enables a reduction in difference between a rise in temperature in the first airtight part and a rise in temperature in the second airtight part.

DESCRIPTION OF EMBODIMENTS

Embodiments of the present disclosure are described in detail hereinafter with reference to drawings. Components that are the same or equivalent are assigned the same reference signs throughout the drawings.

Figure 1:
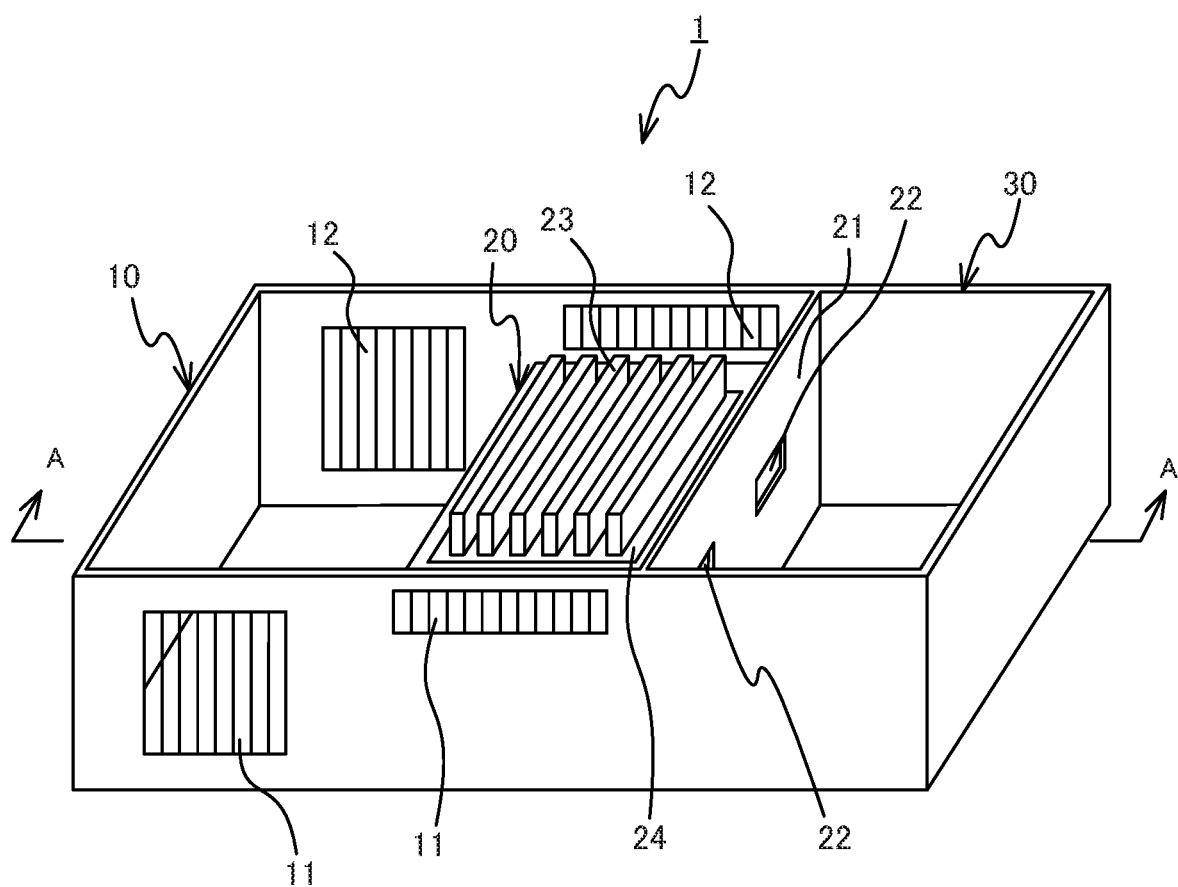
FIG. 1 is a perspective view of a housing for a power conversion device according to an embodiment of the present disclosure.

FIG. 1 is a perspective view of a housing for a power conversion device according to an embodiment of the present disclosure. The upper portion of a power conversion device 1 is omitted in FIG. 1. The inside space of a housing of the power conversion device 1 is partitioned by a partition wall, and the power conversion device 1 includes an open part 10 into which external air that is air outside of the power conversion device 1 flows, a first airtight part 20 into which no external air flows, the first airtight part 20 being adjacent to the open part 10, and a second airtight part 30 into which no external air flows, the second airtight part 30 being adjacent to the first airtight part 20. In the power conversion device 1 illustrated in FIG. 1, a direction along which the open part 10 and the first airtight part 20 align with each other matches a direction along which the first airtight part 20 and the second airtight part 30 align with each other. The power conversion device 1 is mounted, for example, under a floor of an electric railroad vehicle.

The housing forming the open part 10 is provided with an inflow port 11 and a discharge port 12. In the example of FIG. 1, the inflow port 11 and the discharge port 12 are formed in each of two sides of the housing facing each other in a direction perpendicular to the direction along which the open part 10 and the first airtight part 20 align with each other. At least two ventilation holes 22 are formed in a partition wall 21 between the first airtight part 20 and the second airtight part 30. At least one of the ventilation holes 22 is provided with a circulation fan that is described below in detail. The housing forming the first airtight part 20, that is, an outer surface of the first airtight part 20, is provided with a heatsink 23 to release to the external air at least some of heat transferred from an electronic component placed in the first airtight part 20. In the example of FIG. 1, the heatsink 23 is exposed to the open part 10. Although, in the example illustrated in FIG. 1, a straight-fin heatsink is used as the heatsink 23, any type of heatsink, such as a pin-fin heatsink, may be used as the heatsink 23. The heatsink 23 is formed on a substrate 24 and releases heat transferred from the electronic component placed on the opposite surface of the substrate 24, that is, inside the first airtight part 20. Although, in the example illustrated in FIG. 1, the heatsink 23 is exposed to the open part 10 through an opening area formed on the upper side of the housing above the first airtight part 20, a location at which the heatsink 23 is placed is not limited to the location of the heatsink 23 illustrated in FIG. 1. Although any aspect of the power conversion device 1 may be freely defined, wind caused by movement of the vehicle can be taken into the open part 10 by making a direction in which the inflow port 11 faces the discharge port 12 match a traveling direction of the electric railroad vehicle in the case of the power conversion device 1 illustrated in FIG. 1.

Figure 2:
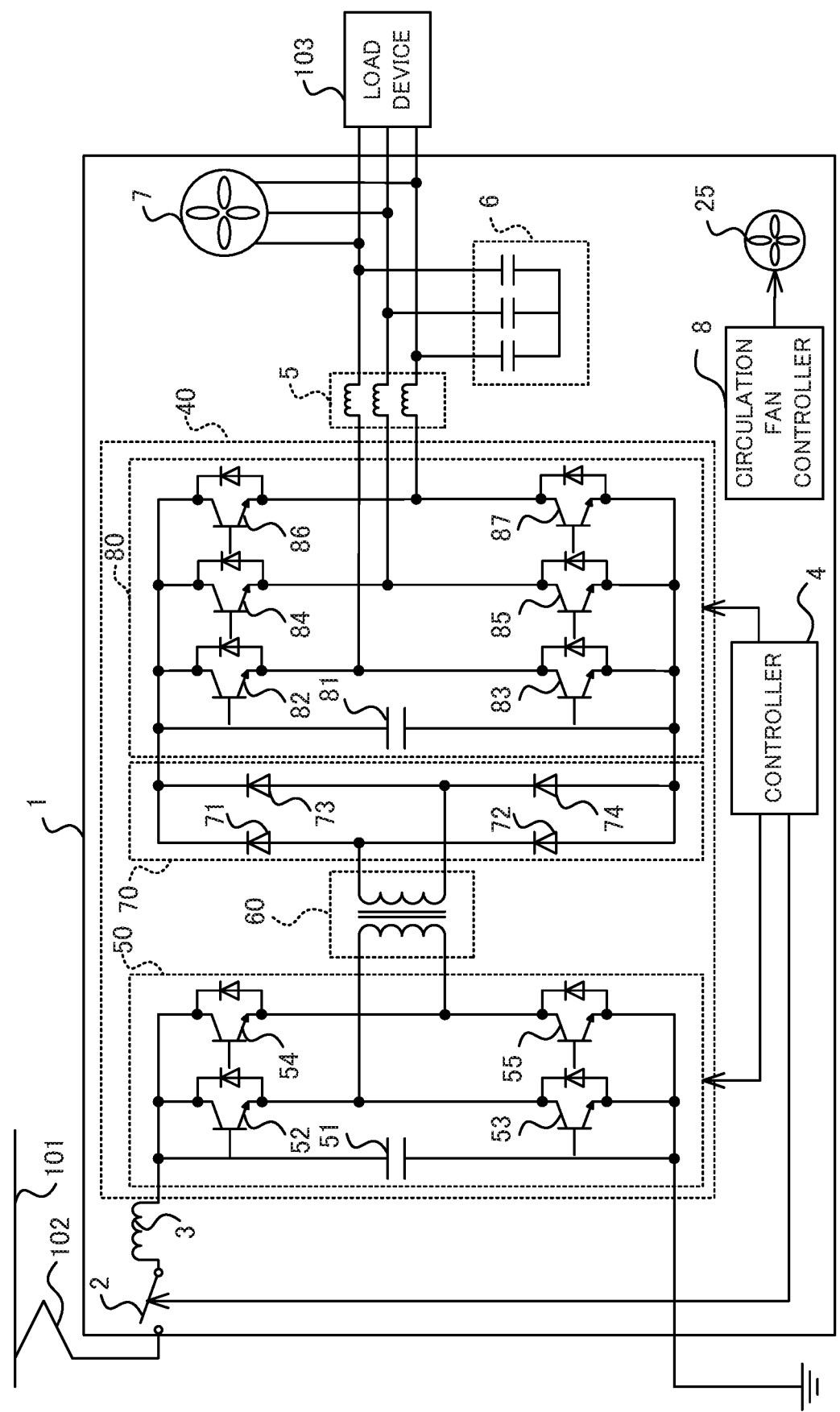
FIG. 2 is a drawing illustrating an example of a configuration of an electric railroad vehicle including the power conversion device according to the embodiment.

FIG. 2 is a drawing illustrating an example of a configuration of an electric railroad vehicle including the power conversion device according to the embodiment. The power conversion device 1 converts power acquired from an overhead line 101 via a power collector 102 to supply power to a load device 103 such as an air conditioner or an illuminating device, the load device 103 being connected to the output side of the power conversion device 1. The power acquired from the overhead line 101 is inputted into a power converter 40 via a switch 2 and an input reactor 3. The power converter 40 includes a primary circuit 50, a transformer 60, a secondary circuit 70, and a three-phase inverter circuit 80. In an example illustrated in FIG. 2, switching elements 52, 53, 54 and 55 include in the primary circuit 50 as an inverter circuit and switching elements 82, 83, 84, 85, 86 and 87 that the three-phase inverter circuit 80 includes are insulated gate bipolar transistors (IGBT) but any semiconductor element may be used.

The primary circuit 50 converts direct current power into high-frequency single-phase alternating current power. In the example illustrated in FIG. 2, the primary circuit 50 has a full bridge circuit structure but may instead have a half bridge circuit structure or another structure. The transformer 60 is connected to the primary circuit 50 and the secondary circuit 70 and performs power conversion with the primary side insulated from the secondary side. The secondary circuit 70 rectifies a high-frequency alternating current (AC) voltage inputted from the transformer 60 into a direct current DC voltage and applies the DC voltage to a capacitor 81 included in the three-phase inverter circuit 80. A connection point between the switching elements 52 and 53 is connected to one end of a primary winding of the transformer 60 via a connection conductor, and a connection point between the switching elements 54 and 55 is connected to the other end of the primary winding of the transformer 60 via a connection conductor. One end of a secondary winding of the transformer 60 is connected to a connection point between diodes 71 and 72 via a connection conductor, and another end of the secondary winding of the transformer 60 is connected to a connection point between the diodes 73 and 74 via a connection conductor. In order to prevent the connection conductors from generating heat, thin-plate shaped copper conductors or litz wires are used as the connection conductors.

The three-phase inverter circuit 80 performs power conversion to output a three-phase AC voltage having a desired frequency and desired magnitude. A controller 4 controls: a switching operation of the switch 2; and switching operations of the switching elements 52, 53, 54, 55, 82, 83, 84, 85, 86, and 87. A circulation fan controller 8 controls a circulation fan 25 such that the circulation fan 25 runs during operation of the power conversion device 1. Power is supplied to the controller 4, the circulation fan controller 8, and the circulation fan 25 from an internal power source that the power conversion device 1 includes.

A reactor 5 that includes alternating-current reactors placed for the respective phases, a capacitor 6 that includes alternating-current capacitors connected to lines of the respective phases, a cooling blower 7, and the load device 103 are connected to the output side of the power converter 40. The reactor 5 and the capacitor 6 constitute a smoothing filter circuit and the smoothing filter circuit smooths a waveform of a pulsed voltage outputted by the three-phase inverter circuit 80, thereby obtaining sine wave alternating current.

Figure 3:
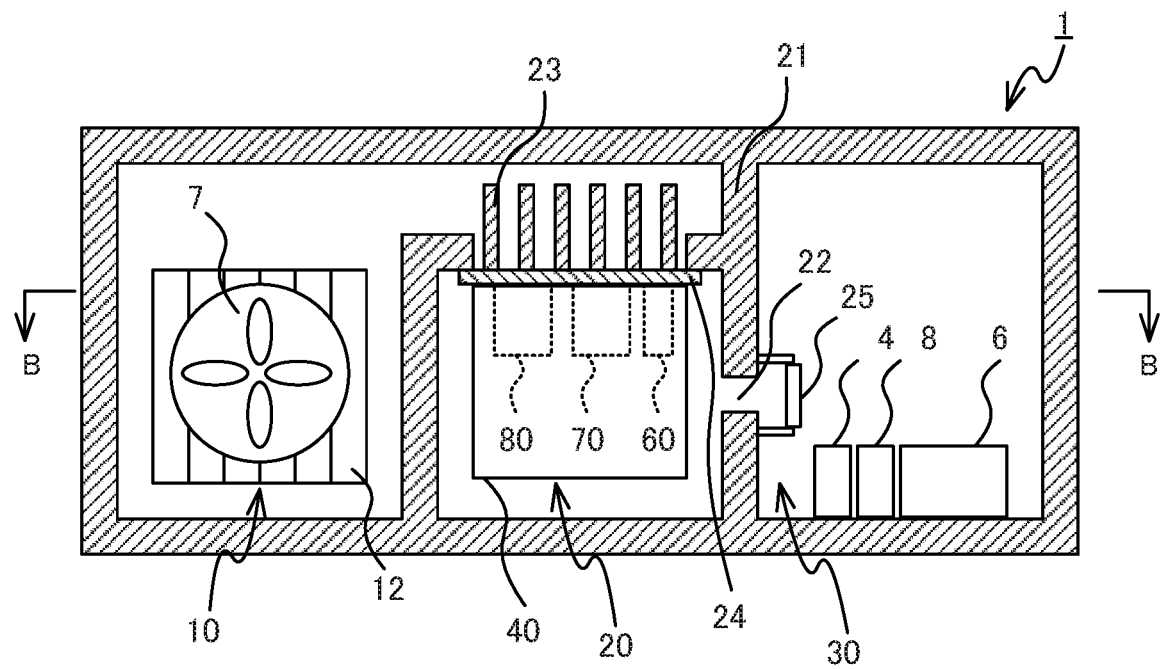
FIG. 3 is a cross-sectional view of the power conversion device according to the embodiment.
Figure 4:
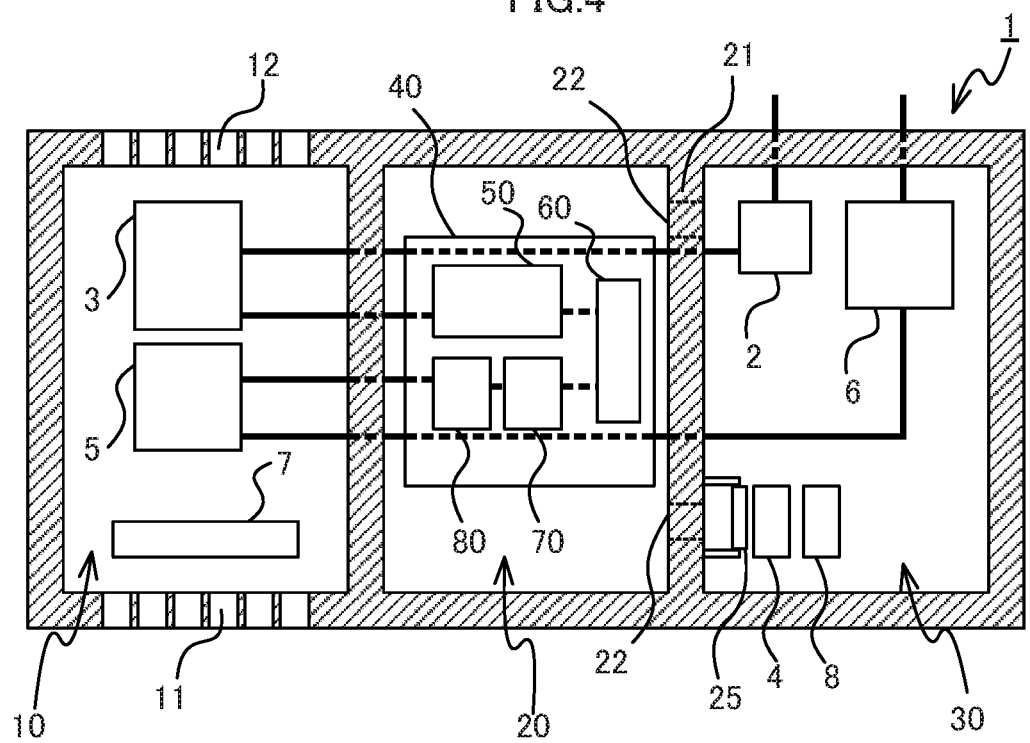
FIG. 4 is another cross-sectional view of the power conversion device according to the embodiment.

Placement of the respective components of the power conversion device 1 in the housing of the power conversion device 1 illustrated in FIG. 1 is described below. FIGS. 3 and 4 are cross-sectional views of the power conversion device according to the embodiment. FIG. 3 is a cross-sectional view of the power conversion device 1 along A-A line illustrated in FIG. 1 and FIG. 4 is a cross-sectional view of the power conversion device 1 along B-B line illustrated in FIG. 3. High-frequency large AC currents flow through the primary circuit 50, the transformer 60, the secondary circuit 70, and the three phase inverter circuit 80 that are included in the power converter 40. Therefore, the primary circuit 50, the transformer 60, the secondary circuit 70, and the three-phase inverter circuit 80 release more heat than the other components. Therefore, the primary circuit 50, the transformer 60, the secondary circuit 70, and the three-phase inverter circuit 80 are placed in the first airtight part 20 in which heat generated in the housing is released from the housing and the heatsink 23.

Since the switch 2, the controller 4, the capacitor 6, and the circulation fan controller 8 release less heat than the above components included in the power converter 40 and may fail to operate properly due to dust and moisture, the switch 2, the controller 4, the capacitor section 6, and the circulation fan controller 8 are placed in the second airtight part 30. The input reactors 3 and the alternating-current reactors included in the reactor 5 are made by winding conductive material such as copper or aluminum into a coil shape. Since the resistance of the conductors of the input reactor 3 and the reactor 5 causes a large loss during operation of the power conversion device 1, the input reactor 3 and the reactor 5 have to be forcefully cooled with air. Therefore, the input reactor 3 and the reactor 5 are placed in the open part 10. The cooling blower 7 is placed in the open part 10 such that the cooling blower 7 blows air from the inflow port 11 to the discharge port 12.

The connection conductor connecting the switch 2 to the input reactor 3 and the connection conductor connecting the reactor 5 to the capacitor 6 are inserted into holes (not illustrated in the drawings) formed in the partition wall between the open part 10 and the first airtight part 20 and in the partition wall 21 between the first airtight part 20 and the second airtight part 30. The connection conductor connecting the input reactor 3 to the power converter 40 and the connection conductor connecting the reactor 5 to the power converter 40 are inserted into holes (omitted in the drawings) formed in the partition wall between the open part 10 and the first airtight part 20.

The heat generation amount of the components placed in the first airtight part 20 is different from the heat generation amount of the components placed in the second airtight part 30. As the first airtight part 20 differs from the second airtight part 30 in volume and in surface area, an amount of heat released from the first airtight part 20 is different from an amount of heat released from the second airtight part 30. As a result, such a difference between the first air tight part 20 and the second airtight part 30 causes a difference between the first airtight part 20 and the second airtight part 30 in amount of rise in temperature. At least one of at least two ventilation holes 22 formed in the partition wall 21 between the first airtight part 20 and the second airtight part 30 is provided with the circulation fan 25. The circulation fan controller 8 operates the circulation fan 25 in accordance with a required quantity of airflow blown by the circulation fan 25 that is previously calculated based on estimate values of amounts of change in temperature in the first airtight part 20 and the second airtight part 30. When the circulation fan 25 runs, air in the first airtight part 20 moves to the second airtight part 30, the same amount of air moves from the second airtight part 30 to the first airtight part 20, thereby circulating air between the first airtight part 20 and the second airtight part 30. The air circulation in the first airtight part 20 and the second airtight part 30 that is generated by the circulation fan 25 enables reduction of a difference between the first airtight part 20 and the second airtight part 30 in amount of rise in temperature.

In the case where a switching frequency of the primary circuit 50 is about 20 kHz and the electronic components of the power conversion device 1 mounted on an electric railroad vehicle are placed in the first airtight part 20 and the second airtight part 30 as illustrated in FIGS. 3 and 4, an amount of heat released to the first airtight part 20 is about 500 W, whereas an amount of heat generation in the second airtight part 30 is about 100 W. That is to say, a rise in temperature in the first airtight part 20 is greater than a rise in temperature in the second airtight part 30. Air circulation between the first airtight part 20 and the second airtight part 30 generated by operation of the circulation fan 25 enables suppression or prevention of a rise in temperature in the first airtight part 20. A required quantity of airflow blown by the circulation fan 25 is calculated based on estimate values of heat resistance temperatures of and amounts of change in temperature of the electronic components placed in the first airtight part 20 and the second airtight part 30. The estimate values of amounts of change in temperature can be calculated from estimate values of the amounts of heat generation and the estimate values of the amounts of heat released.

Since the second airtight part 30 is not provided with a heatsink, heat generated in the housing is released from the housing. Insufficient release of heat from the housing may cause a temperature rise in the second airtight part 30 that is greater than a temperature rise in the first airtight part 20. Even in that case, air circulation between the first airtight part 20 and the second airtight part 30 generated by operation of the circulation fan 25 enables suppression or prevention of a temperature rise in the second airtight part 30. Operation of the circulation fan 25 enables reduction in a difference between temperature rises in the first airtight part 20 and the second airtight part 30.

In the case where the switching frequency of the primary circuit 50 is about 20 kHz, currents of about several hundred amperes having a frequency of about 20 kHz flow through the connection conductor between the primary circuit 50 and the transformer 60 and through the connection conductor between the secondary circuit 70 and the transformer 60, thereby causing the connection conductors to generate large amounts of heat. As illustrated in FIGS. 3 and 4, the primary circuit 50, the transformer 60 and the secondary circuit 70 are placed in the first airtight part 20 and connection conductors short in length are used as the connection conductor between the primary circuit 50 and the transformer 60 and as the connection conductor between the secondary circuit 70 and the transformer 60 thereby enabling reduction in amounts of heat generated by the connection conductors because of the skin effect.

Although the circulation fan 25 is operated based on a previously calculated required amount of airflow in the above example, the circulation fan 25 may be operated based on a temperature difference between the first airtight part 20 and the second airtight part 30. The circulation fan controller 8 acquires measurement values of temperature from temperature sensors with which the first airtight part 20 and the second airtight part 30 are provided, calculates a required amount of airflow blown by the circulation fan 25 in accordance with a temperature difference between the first airtight part 20 and the second airtight part 30, and regulates an amount of airflow blown by the circulation fan 25 in accordance with the calculated required amount of air flow. The circulation fan controller 8 may detect the magnitude of currents flowing through the connection conductors in the first airtight part 20 and the magnitude of currents flowing through the connection conductors in the second airtight part 30, calculate a required amount of airflow blown by the circulation fan 25 in accordance with a difference between the detection values, and regulate an amount of airflow blown by the circulation fan 25 in accordance with the calculated required amount of airflow.

As described above, the power conversion device 1 according to the embodiment has the structure in which: at least two ventilation holes 22 are formed in the partition wall 21 between the first airtight part 20 and the second airtight part 30; and at least one of the two ventilation holes 22 is provided with the circulation fan 25. Thus, the power conversion device 1 enables reduction in a difference between temperature rises in the first airtight part 20 and in the second airtight part 30. The reduction in the differences between temperature rises of the components in the housing results in suppression or prevention of generation of an excessively high temperature in the more heat-susceptible electronic components, improvement in a reliability of the power conversion device 1, and prolongation of the life of the power conversion device 1.

Embodiments of the present disclosure are not limited to the above embodiment. A structure for the power converter 40 is not limited to the structure illustrated in FIG. 2, and the power converter 40 may be a power conversion circuit that includes a capacitor and a switching element without having a transformer, a direct-current-to-direct-current converter (DC-DC converter), or a chopper circuit. There is no need for the power conversion device 1 to include the cooling blower 7 and each component of the power conversion device 1 may be cooled by a wind caused by movement of the electric railroad vehicle. The power conversion device 1 may be placed on a roof of the electric railroad vehicle instead of placing the power conversion device 1 under a floor of the electric railroad vehicle. The number of airtight parts formed in the present disclosure is not limited to two, and the power conversion device 1 may include three or more airtight parts. In that case, at least two ventilation holes are formed in a partition wall between each pair of airtight parts adjacent to each other.

Figure 5:
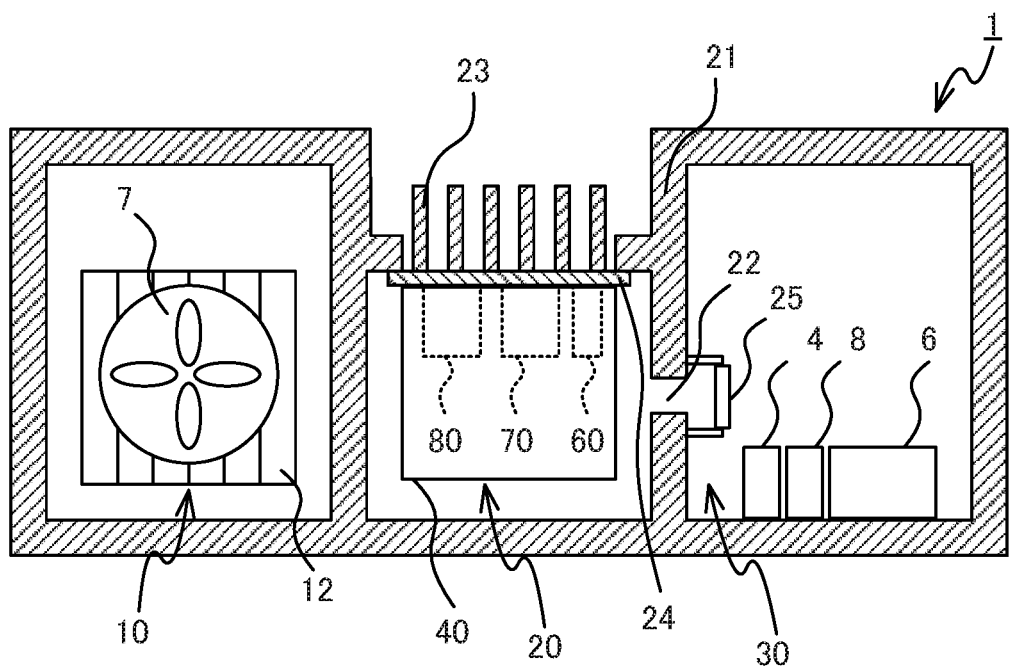
FIG. 5 is yet another cross-sectional view of the power conversion device according to the embodiment.
Figure 6:
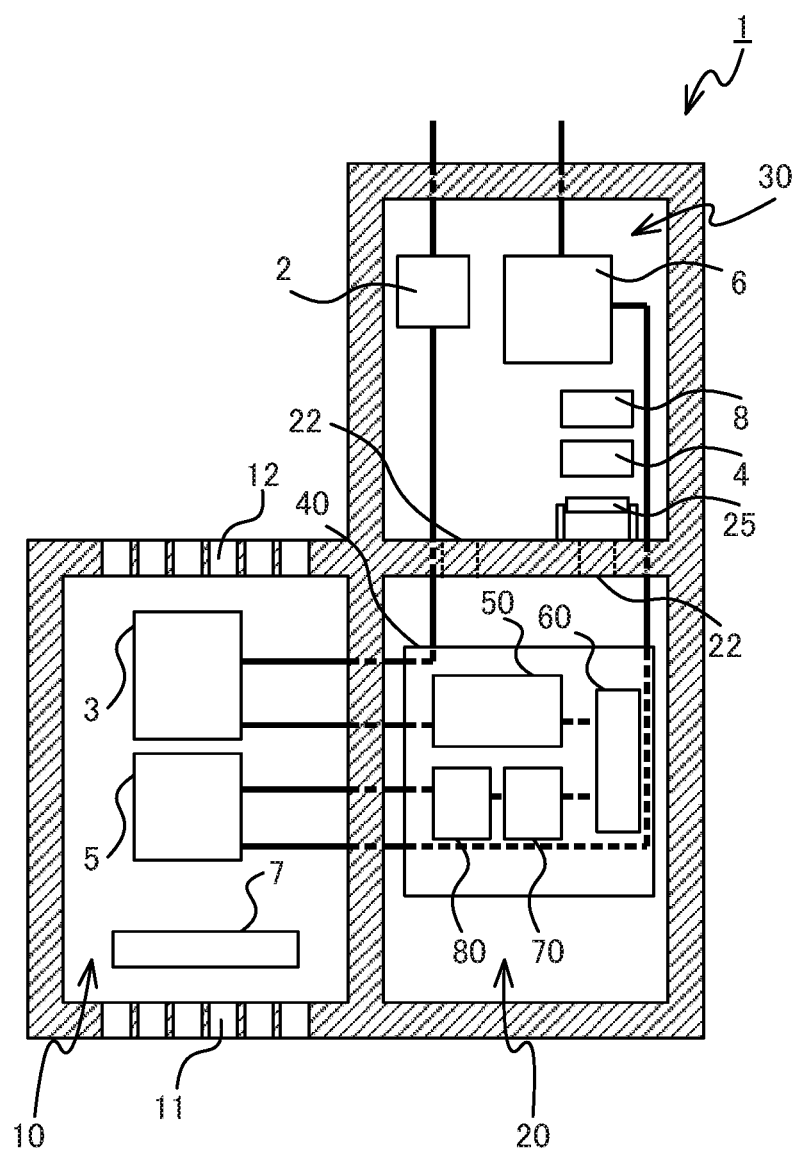
FIG. 6 is yet another cross-sectional view of the power conversion device according to the embodiment.
Figure 7:
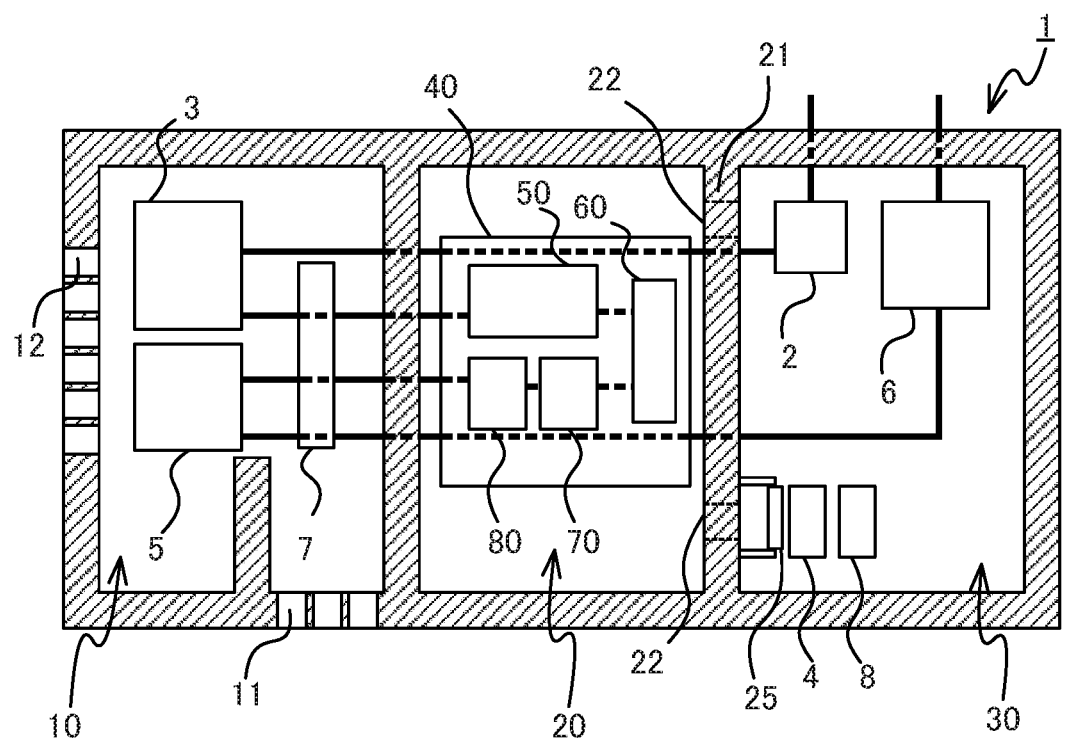
FIG. 7 is yet another cross-sectional view of the power conversion device according to the embodiment.

A structure for the power conversion device 1 is not limited to the above structure. FIGS. 5, 6 and 7 are cross-sectional views of the power conversion device according to the embodiment. In the power conversion device 1 illustrated in FIG. 5, the heatsink 23 is exposed to the outside of the power conversion device 1. In the power conversion device 1 illustrated in FIG. 6, a direction along which the open part 10 aligns with the first airtight part 20 is perpendicular to a direction along which the first airtight part 20 aligns with the second airtight part 30. In the power conversion device 1 illustrated in FIG. 7, the inflow ports 11 and the discharge ports 12 are formed in two side portions among portions of the housing forming the open part 10, the two lateral side portions being adjacent to each other.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Power conversion device
2 Switch
3 Input reactor
4 Controller
5 Reactor
6 Capacitor
7 Cooling blower
8 Circulation fan controller
10 Open part
11 Inflow port
12 Discharge port
22 Ventilation hole
20 First airtight part
21 Partition wall
23 Heatsink
24 Substrate
25 Circulation fan
30 Second airtight part
40 Power converter
50 Primary circuit
51, 81 Capacitator
52, 53, 54, 55, 82, 83, 84, 85, 86, 87 Switching element
60 Transformer
70 Secondary circuit
71, 72, 73, 74 Diode
80 Three-phase inverter circuit
101 Overhead line
102 Power collector
103 Load device

The invention claimed is:

1. A power conversion device comprising:
a power convertor for converting an input power to output the converted power;
a reactor connected to an input side of the power convertor;
a controller for controlling an electronic component included in the power convertor;
an open part containing the reactor and allowing inflow of external air into the open part, the external air being air from outside of the power conversion device;
a first airtight part adjacent to the open part, the first airtight part containing the electronic component and being sealed to be free from inflow of the external air into the first airtight part; and
a second airtight part adjacent to the first airtight part, the second airtight part containing the controller and being sealed to be free from inflow of the external air into the second airtight part, wherein
at least two ventilation holes are formed in a partition wall between the first airtight part and the second airtight part,
the power conversion device comprises:
a circulation fan that is provided in at least one of the ventilation holes; and
a heatsink that is placed in a housing forming the first airtight part and that releases to outside of the power conversion device, at least some of heat transferred from the electronic component placed in the first airtight part.

2. The power conversion device according to claim 1, further comprising:

a circulation fan controller to cause the circulation fan to operate in accordance with a required amount of airflow blown by the circulation fan, the required amount of airflow being previously calculated based on estimate values of amounts of change in temperature in the first airtight part and the second airtight part.

3. The power conversion device according to claim 1, further comprising:
a circulation fan controller to regulate an amount of airflow blown by the circulation fan in accordance with a temperature difference between the first airtight part and the second airtight part.

4. The power conversion device according to claim 1, wherein
the housing forming the open part is provided with an inflow port and an discharge port and
the power conversion device further comprises a cooling blower that is placed in the open part and that blows air such that the air flows from the inflow port to the discharge port.

\* \* \* \* \*